Oct. 12, 1965 W. M. KAUFMAN 3,212,032

NARROW BAND REJECTION FILTER AND TUNABLE MONOLITH FOR USE THEREIN

Filed Jan. 27, 1960 4 Sheets-Sheet 1

Oct. 12, 1965 W. M. KAUFMAN 3,212,032

NARROW BAND REJECTION FILTER AND TUNABLE MONOLITH FOR USE THEREIN

Filed Jan. 27, 1960 4 Sheets-Sheet 2

WITNESSES:

Bernard R. Gieguey

James F. Young

INVENTOR

William M. Kaufman

BY Maury I. Hull

ATTORNEY

Oct. 12, 1965 W. M. KAUFMAN 3,212,032

NARROW BAND REJECTION FILTER AND TUNABLE MONOLITH FOR USE THEREIN

Filed Jan. 27, 1960 4 Sheets-Sheet 3

United States Patent Office 3,212,032
Patented Oct. 12, 1965

3,212,032
NARROW BAND REJECTION FILTER AND TUNABLE MONOLITH FOR USE THEREIN

William M. Kaufman, Pitcairn, Pa., assignor to Westinghouse Electric Corporation, East Pittsburgh, Pa., a corporation of Pennsylvania Filed Jan. 27, 1960, Ser. No. 5,045
6 Claims. (Cl. 333—70)

This invention relates to an improved narrow band rejection filter and to a tunable monolithic semiconductor structure for use therein.

Frequency selectivity is normally obtained in electronic systems by means of inductor capacitor (L–C) tuned circuits. The problem that arises when such devices as frequency selective amplifiers or filter circuits are to be constructed from solid state materials in accordance with molecular engineering concepts is the one of creating the frequency selectivity without the use of L–C tuned circuits. This is necessary because as yet no significant inductors have been invented that are suitable for monolithic construction.

As is well known in the communications art, there are a number of circuits for obtaining frequency selectivity which employ only resistance and capacitance. Some of the better known of these are the Wein bridge, the twin-T and the bridged-T null networks. Other frequency selective R–C circuits are described in the literature. However, in general these devices employ lumped parameters, and in the construction and fabrication of semiconductors attempts to concentrate the effects of distributed parameters into localized regions so that the distributed parameters could act electrically more like lumped parameters in the circuits have been in general unsuccessful for the reason that localization of parameters requires the accurate placement of impurities in the semiconductor material, and under present techniques the accurate placement of impurities in semiconductors is sometimes very difficult to obtain.

In summary the apparatus of the instant invention in one embodiment thereof comprises a structure, which may be rectangular in shape, which includes a layer of high dielectric material. A thin resistive coating on one surface of the high dielectric layer has a pair of spaced ohmic contacts or leads thereto, whereas the other surface of the high dielectric layer has thereon a good conductor preferably extending over the entire surface. This conductor is connected by way of a resistor to one input and one output terminal of the filter, whereas the two connections to the aforementioned thin resistive coating form the other input and the other output terminal of the filter. As an alternative construction, a layer of resistive material having a selected distributed resistance per unit length may replace the external resistor. The apparatus of the instant invention also includes a semiconductor element which does not require the concentrating of the effects of distributed parameters and which may be constructed of a single p-n junction and if desired may be rectangular in shape. A highly doped region of one conductivity type, for example n-type, is contiguous to a lesser doped region of the other conductivity type, p-type. A highly conductive ohmic contact is made preferably to the entire surface of the highly doped or n-type region and a reverse bias is applied to the p-n junction. This results in the creation of a depletion layer adjacent the boundary between the p-type region and the n-type region. The lesser doped region substantially exclusively of the depletion layer becomes in effect a distributed series resistance, and the depletion layer resulting from the reverse-biased p-n junction also results in distributed shunt capacitance between the p-type region and the n-type region, the depletion layer creating effective capacitance since it is depleted of carriers, effectively forming the dielectric. Spaced ohmic contacts on the lesser doped region provide a filter input terminal and a filter output terminal. The other filter input lead and output lead are made through a series resistor to the highly doped region. Biasing means including a source of direct current potential which is connected either in series with the resistor or across the filter output leads provides for applying the necessary reverse biasing potential, where a semiconductor structure is employed.

Accordingly, a primary object of the instant invention is to provide a new and improved narrow-band rejection filter employing a monolithic frequency selective structure.

Another object is to provide a new and improved tunable monolith.

These and other objectives will become more clearly apparent after a study of the following specification when read in connection with the accompanying drawings in which.

Figure 1:
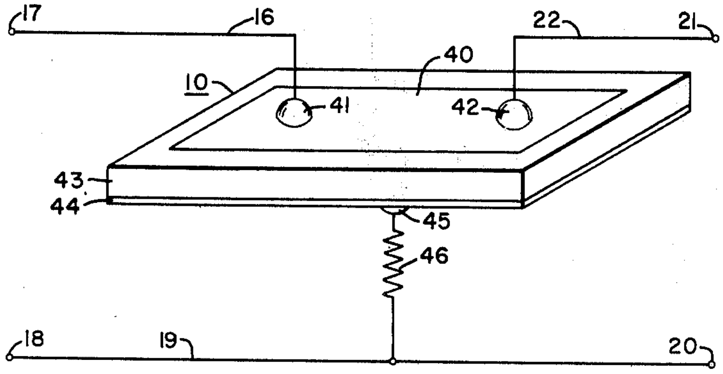
FIG. 1 is a view of a narrow-band rejection filter and a monolithic filter element according to one embodiment of the invention.

Referring now to the drawings for a more detailed understanding of the invention, and in particular to FIG. 1 thereof, there is shown a monolith generally designated 10. A layer of high dielectric material 43 is provided, which may be barium titanate, and which has thereon a thin resistive coating 40 which may be chromium, the resistive coating 40 having two spaced connections 41 and 42 thereto, connection 41 being connected by lead 16 to one filter input terminal 17 and connection 42 being connected by lead 22 to one filter output terminal 21. A conducting material or contact 44 which is composed of a good conductor such as silver or gold covers preferably the entire lower surface of the layer 43. Connection 45 to conducting material or coating 44 is connected by way of resistor 46 to a lead 19 which is connected to the other filter input terminal 18 and to the other filter output terminal 20.

In operation of the apparatus of FIG. 1, assume that a sinusoidal signal of variable frequency is applied to the input terminals 17 and 18. Assume first for purposes of explanation that the resistor 46 is shorted so that conducting plate or material 44 is directly connected to lead 19. As the frequency of the signal at input terminals 17 and 18 is increased, the portion of the applied signal which is passed through the dielectric 43 to the conducting plate 44 will increase in accordance with the decreasing reactance of the capacitor, and ultimately a frequency will be reached at which substantially all of the signal passes through the dielectric, the effective impedance of the capacitor approaching zero, so that the filter would have the characteristics of a low-pass filter.

Figure 3:
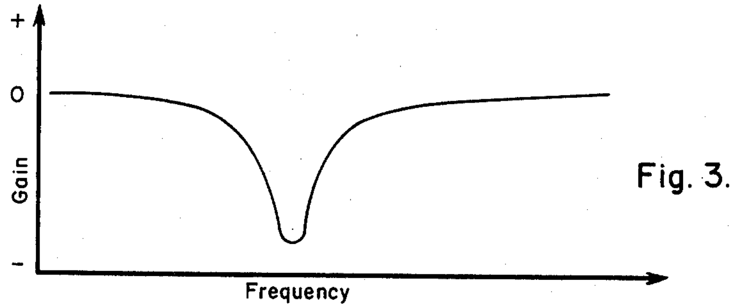
FIG. 3 is a graph illustrating the operation of the apparatus of FIGS. 1 and 2.

An analysis of the operation of the circuit may be simplified by making an analysis as if the circuit had lumped circuit parameters, in which portions of the signal applied to terminal 17 may follow three paths. In actuality, because of the distributed resistance and distributed capacitance of the monolith, each of these three paths consists of many paths, which may overlap in portions thereof. Assume now by way of description that the resistor 46 is in the circuit, and that this resistor approaches the perfect resistor in that it has no substantial capacitance. A first and direct path for the signal is provided through the resistive coating 40 between terminal 41 and terminal 42; an additional or second signal path is provided from contact 41 through dielectric 43 to plate 44, along plate 44 up through dielectric 43 to contact 42; and still an additional or third signal path is provided from contact 41 through the dielectric material 43 to plate 44 and through the resistor 46 to lead 19. The second and third paths are frequency responsive, and as the frequency of the signal is increased the impedance of the third path will constantly decrease with reference to the resistance of the first path through contacts 41 and 42, and the gain of the device will decrease as shown in the curve of FIG. 3 until the null is reached. At this point on the curve of FIG. 3, the voltage or signal at terminal 21 is substantially that resulting from signal division between points 41 and 42, and 41 and 19, resulting from the instant impedances of all paths. As the frequency is further increased the resistance of the second signal path through the dielectric established in parallel with the current path 41–42, that is, the path from terminal 41 through dielectric 43 to conducting material 44 and up through the dielectric in the portion thereof adjacent contact 42 to contact 42 to output terminal 21 becomes increasingly smaller so that the total effective impedance between contacts 41 and 42 further decreases, whereas the impedance of the third path which includes resistance 46 remains substantially constant, causing the gain curve of FIG. 3 to increase in the manner shown. It will be seen that the null or notch filter effect is to some extent dependent upon the value of the resistance 46.

Figure 2:
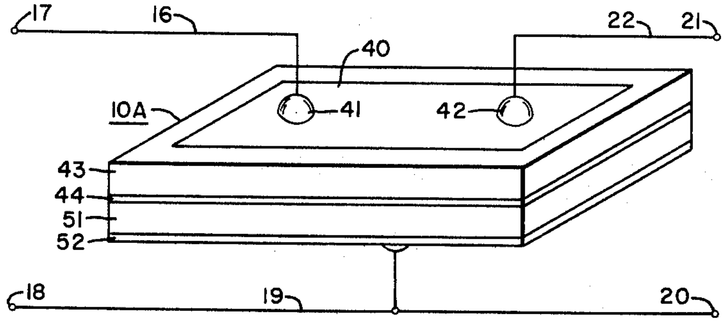
FIG. 2 is a view of another embodiment of the invention.

Particular reference should be made now to FIG. 2 in which a monolith 10A is shown having a layer of high dielectric material 43 with the thin resistive coating 40 on the upper surface thereof and the good conducting material 44 on the lower surface thereof. An additional layer 51 composed of a resistive material is provided adjacent the good conducting material 44, and a conductive electrode 52 preferably covers the entire lower surface of the resistive layer 51. This ohmic contact 52 is directly connected to lead 19, no resistor being required. The resistive layer 51 supplies the effect of the aforementioned resistor 46 described in connection with the apparatus of FIG. 1; otherwise the operation of the apparatus of FIG. 2 is substantially similar to that of FIG. 1.

Figure 5:
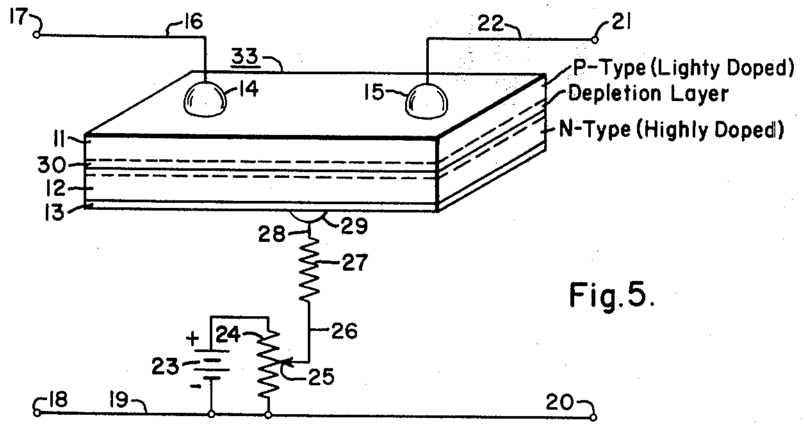
FIG. 5 is a view of a narrow-band rejection filter according to another embodiment of the invention.

Particular reference is made now to FIG. 5. There is shown a monolith generally designated 33. The monolith is seen to be substantially rectangular in shape, to have an upper region or portion of lightly doped p-type semiconductor material 11, a lower region of highly doped n-type semiconductor material 12, and a highly conductive ohmic contact 13 which preferably extends over the entire lower surface of the n-type region. The p-type region 11 is seen to have a pair of ohmic contacts 14 and 15, contact 14 being connected by lead 16 to one filter input terminal 17. The other filter input terminal 18 is connected by way of lead 19 to one output terminal 20, and the other output terminal 21 is connected by lead 22 to the aforementioned ohmic contact 15 for the p-type region 11 of the monolith. Lead 19 is connected to the negative terminal of a battery or other source of direct current potential 23, battery 23 having the potentiometer 24 connected thereacross. The arm 25 of the potentiometer is connected by way of lead 26, resistor 27 and lead 28 to terminal 29 which is preferably integral with the aforementioned ohmic contact plate 13. The battery 23 and potentiometer 24 provide means for applying a reverse bias of adjustable amplitude to the p-n junction, for reasons which will be hereinafter more fully explained. The reverse bias applied to the junction between the highly doped n-type region and the p-type region results in a depletion layer 30 adjacent the boundary between the lightly doped p-type region and the n-type region.

Figure 4:
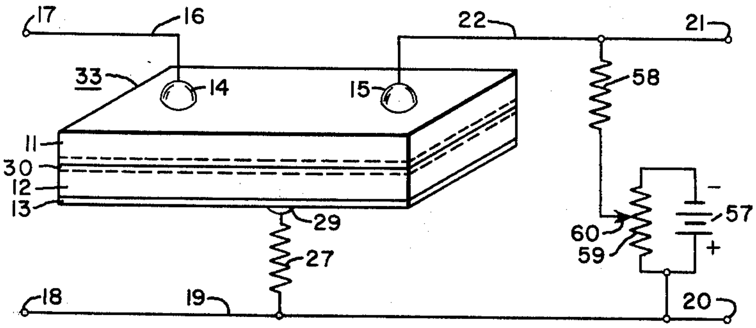
FIG. 4 is a view of the narrow-band rejection filter according to the preferred embodiment of the invention.
Figure 6:
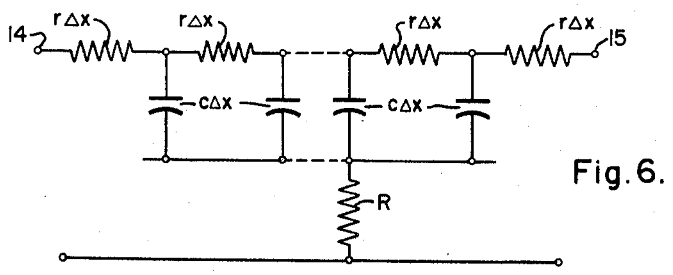
FIG. 6 is an equivalent electrical circuit of the rejection filter of FIGS. 1, 4 and 5.
Figure 8:
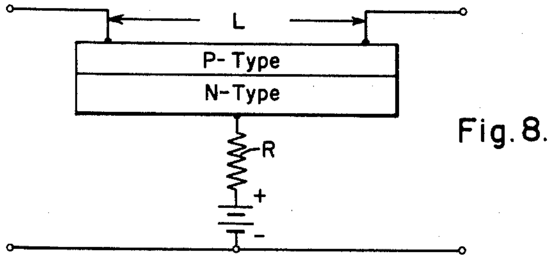
FIG. 8 is an illustrative sketch.

Particular reference should be made now to FIG. 6 in which an equivalent electrical circuit of the structures in FIGS. 1, 4 and 5 is shown. An analysis of the equivalent circuit may be made by methods similar to those discussed in an article entitled "Distributed Parameter Networks for Circuit Miniaturization" by Charles K. Hager, appearing in the Proceedings of the Joint Electronic Components Conference, I.R.E., A.I.E.E., May, 1959. In analyzing the circuit of FIG. 6, L is the length of the device as measured between ohmic contacts 14 and 15, FIG. 5; $r$ and $c$ are the resistance and capacitance per unit length. Mathematical analysis shows that the device will produce the effect of a notch filter with a true zero null under certain readily obtainable conditions. Utilizing nodal equations for one section of the circuit of FIG. 6 and taking the limit as $\Delta x \rightarrow 0$ will produce a system of partial differential equations. Computations can be simplified by ignoring resistance in series with the capacitors since this is negligible, the device being assumed to be rather thin, and the highly doped region being of rather low resistivity. Furthermore, assuming sinusoidal driving functions and expressing all time variation in terms of complex phasor notation, the partial differential equations reduce to second order ordinary differential equations. The solution for gain, the ratio of output to input voltage, under no-load conditions is $$G=\left|\operatorname{sech}\left[(1+j)\left(\frac{\omega}{\omega_1}\right)^{1/2}\right]+\frac{1-\operatorname{sech}\left[(1+j)\left(\frac{\omega}{\omega_1}\right)^{1/2}\right]}{1+\frac{\alpha}{(1+j)}\frac{1}{\left(\frac{\omega}{\omega_1}\right)^{1/2}}\coth\left[(1+j\left(\frac{\omega}{\omega_1}\right)^{1/2}\right]}\right|$$

where $$\alpha=\frac{rL}{R}$$

and $$\omega_1=\frac{2}{L^2rc}$$

$r$ is the distributed resistance per unit length,
$c$ is the distributed junction capacitance per unit length,
L is the device length,
R is the external resistance between contact 29 and lead 19 and includes the value of resistor 27 plus the effective resistance measured between arm 25 of potentiometer 24 and lead 19, it being noted that there are two parallel resistive paths between the arm and lead 19. The battery may be assumed to have an internal impedance near zero.
$\omega$ is the angular frequency of the sinusoidal excitation.

It will be seen that the expression for gain given above is easily calculated as a function of two parameters $\omega/\omega_1$ and $\alpha$ The phase angle, $\phi$ is given by the formula $$\phi=\tan^{-1}\left(\frac{b}{a}\right)$$

where $a = ReG_a$ $b = ImG_a$ [$Re$ is the real part of $G_a$ and $Im$ is the imaginary part of $G_a$, according to the above equation.]

Figure 7:
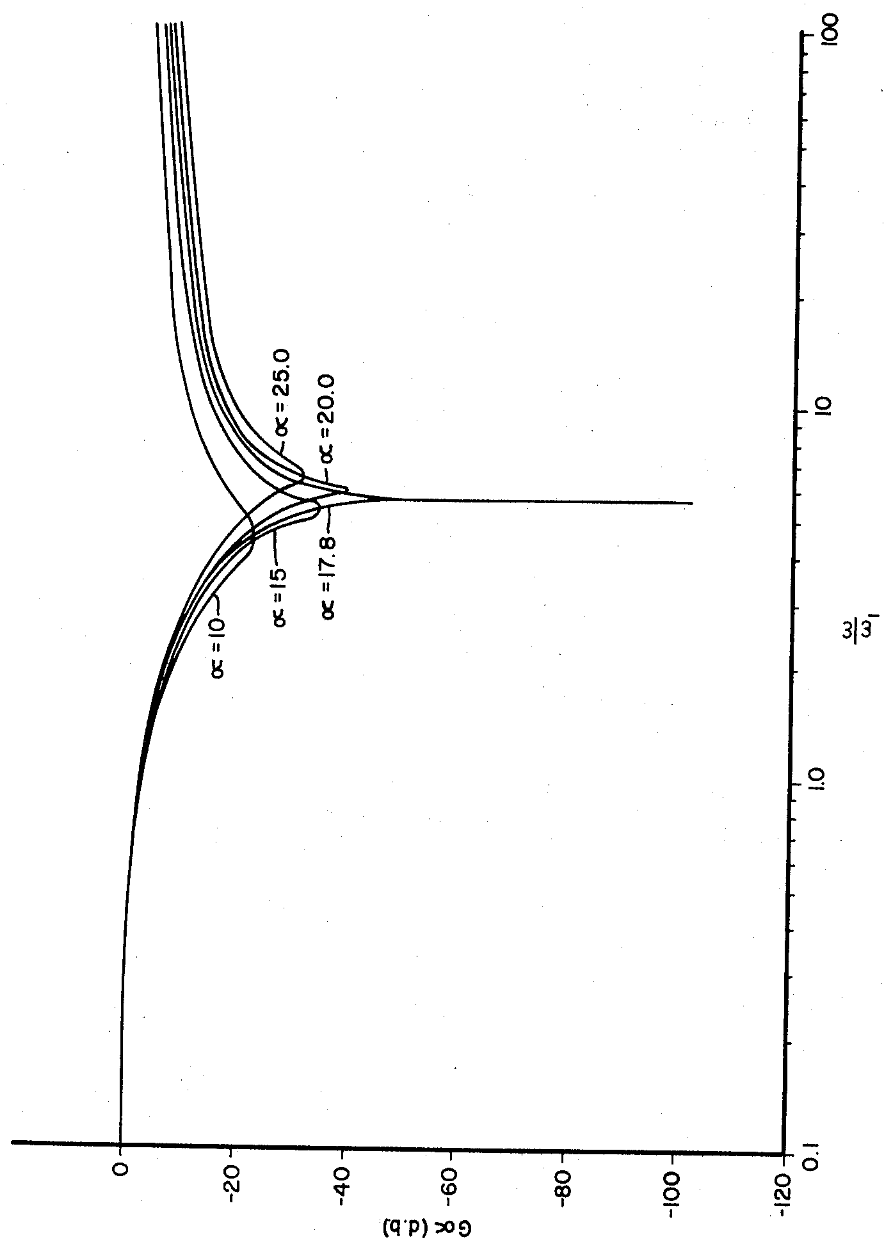
FIG. 7 is a graph illustrating the frequency response of the apparatus of FIGS. 1, 4 and 5.

Particular reference should be made now to FIG. 7 where the response or gain measured in decibels is plotted as a function of frequency for various values of $\alpha$. The gain never exceeds unity.

The calculated curves indicate that $\alpha = 17.8$ is very nearly optimum for no-load operation providing the deepest null and the narrowest bandwith. The null occurs at $$\frac{\omega}{\omega_1} = 5.5935$$

The curves of FIG. 7 show then that the monolith structure of FIG. 5 has very desirable null characteristics while having a very simple structure. It can be shown that $$G\alpha_0\left(\frac{\omega_0}{\omega_1}\right) = 0$$

where $$\alpha_0 = 2\left(\frac{\omega_0}{\omega_1}\right)^{1/2} \cosh\left(\frac{\omega_0}{\omega_1}\right)^{1/2} \sin\left(\frac{\omega_0}{\omega_1}\right)^{1/2}$$

$\omega_0/\omega_1$ are the positive, odd-numbered solutions of $$-\tanh\left(\frac{\omega_0}{\omega_1}\right)^{1/2} = \tan\left(\frac{\omega_0}{\omega_1}\right)^{1/2}$$

The first intersection or solution is at $$\left(\frac{\omega_0}{\omega_1}\right)^{1/2} \doteq 2.3654, \ \alpha_0 \doteq 17.786$$

Among the advantages provided by the instant invention over lumped parameter null circuits are particularly to be noted those which lie in fabrication techniques. The invention herein described may be simply created from an elementary semiconductor structure of very small size. Experimental tests of samples 90 mils long, 40 mils wide and 3 mils thick showed them to be operable in the 1 to 6 megacycle range with nulls adjustable with bias potential from 1.5 mc. to 5.8 mc.

Particular reference should be made now to FIG. 4, in which a filter similar to that of FIG. 5 is shown except that the biasing potential is applied between lead 22 and lead 19. Battery 57 has potentiometer 59 connected thereacross, one end of the potentiometer being connected to lead 19, the arm 60 of potentiometer 59 being connected by way of resistor 58 to the aforementioned lead 22. This circuit has the advantage that the arm of the potentiometer can be adjusted to vary the bias without varying the value of the series resistance, resistor 27 forming the entire series resistance. In order that an undesirably large load is not placed on the filter output, the resistor 58 should have a value at least ten times as great as the value $rL$.

The word "doped" is employed herein to indicate impurities of the donor and acceptor types added to intrinsic semiconductor material.

Another advantage of the semiconductor embodiments of the instant invention is the adjustability and tunability of the devices. By changing the value or amplitude of the reverse bias potential, both $r$ and $c$ can be changed; therefore it is possible to alter the frequency at which the null occurs. Some compensating adjustment may be desirable in the value of R in order to maintain the optimum $\alpha$ ratio. Resistor 27 may be made variable if desired.

In summary, the semiconductor embodiments of the invention provide novel circuit arrangements in which a lumped resistance R is used in connection with distributed resistance and distributed capacitance of a reverse-biased p-n semiconductor junction to obtain null or "notch filter" circuit performance. It will be readily understood that the n and p-type regions could be interchanged and the polarity of the bias battery 23 or 57 reversed without any change in operation. Furthermore, the invention contemplates other ways in which the reverse bias potential can be applied to the junction. The invention includes other arrangements of the ohmic contacts on region 11.

The notch filter may find utility in a phase shift oscillator and in a threshold transducer. A transducer and a phase shift oscillator employing a similar monolith are described in a copending application Serial No. 5,001, filed January 27, 1960, assigned to the assignee of the instant application, and now abandoned.

Figure 9:
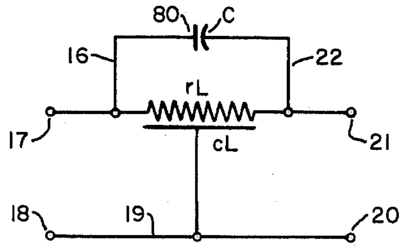
FIG. 9 is an equivalent circuit of other embodiments.

Particular reference is made now to FIG. 9 in which the equivalent circuit of other embodiments of the narrow band rejection filter, each of which is a complementary structure to that of FIGURE 1 or 4 is shown. In FIGURE 9 it is noted that resistor 27 or 46 has been omitted and replaced by capacitor 80 connected between the input and output terminals 17 and 21.

Figure 10A:
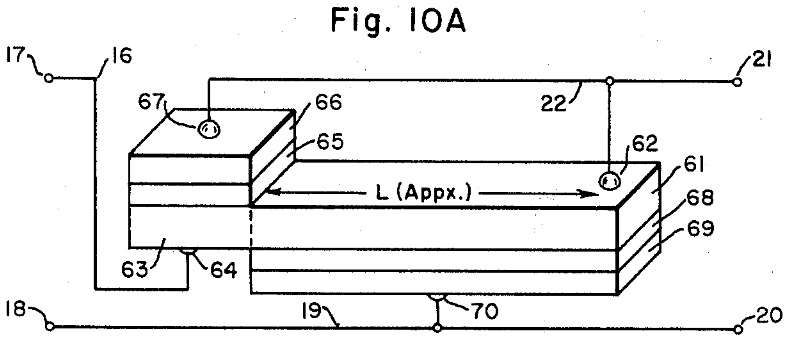
FIGS. 10A and 10B are structural views of two additional embodiments according to FIG. 9.

Particular reference is made now to FIGURE 10A in which one embodiment of a complementary structure is shown. An elongated piece of resistive material 61, which may be rectangular in shape, and which may be composed of intrinsic or lightly doped semiconductor material, has an ohmic contact 62 near one end thereof corresponding to the contact 42 of FIGS. 1 and 2 or the contact 15 of FIGS. 4 and 5. Contact 62 is connected by way of lead 22 to a circuit output terminal 21. At the left hand end of 61 and preferably formed integrally therewith is a section 63 of good conducting material. It will be understood that where semiconductor material is employed the good conducting portion 63 may be formed by proper doping of the semiconductor material. On the lower surface of the portion 63 is an ohmic contact 64 connected by lead 16 to circuit input terminal 17. Adjacent the portion 63 on the upper surface thereof is a layer of very good dielectric material 65 and adjacent the other surface of the dielectric layer 65 is a layer 66 of good conducting material having ohmic contact 67 thereon connected to lead 22. It will be noted that the capacitor formed of conductive portions 63 and 66 by the dielectric layer 65 is directly connected between input and output terminals 17 and 21 and supplies the capacitor C indicated in FIG. 9 by the reference numeral 80. Adjacent the lower surface of the resistive material or portion 61 is an additional layer of dielectric material 68 and adjacent the lower surface of the dielectric layer 68 is a layer of good conductor material 69 connected at ohmic contact 70 to lead 19 and thence to both filter input terminal 18 and filter output terminal 20.

It will be seen that the arrangement of the extended rectangular resistive layer 61 provides the distributed resistance $rL$ indicated in FIG. 9 with the adjacent dielectric layer 68 and conductive layer 69 providing the distributed capacitance $cL$ of FIGURE 9.

It will be further understood that where semiconductor materials are employed in the structure of FIG. 10A various sections may be doped to form p-n junctions of the desired types, and that any convenient means, not shown, may be utilized for applying reverse biases to the two p-n junctions to create depletion layers which will provide in the semiconductor monolith the equivalent of the dielectric layers of the apparatus shown.

It will be noted that the circuit of FIGURE 9, that is, the equivalent circuit and the structure of FIGURE 10A are similar to the structure of FIG. 1 except that the resistor 46 of FIG. 1 has been removed and a capacitor C designated by the reference numeral 80 connected between the input and output terminals. An expression for gain similar to that previously given for the no load gain $$G_\gamma\left(\frac{\omega}{\omega_1}\right)$$

for the circuits or apparatus of FIGS. 1, 2, 4 and 5 is also applicable to the changed structure of FIGURE 10A.

If $$G_\gamma\left(\frac{\omega}{\omega_1}\right)$$

is the no load gain for the structure of FIGURE 10, and if $\gamma$ is defined as $cL/C$, where $c$ is the distributed capacitance per unit length of the structure, $r$ is the resistance per unit length, L is the length of the structure measured approximately between terminal 62 and the near side of conductive region 63 (although this is only approximate and in actuality the effective length L depends upon geometry and configuration) C is the capacitance of the capacitor 80 connected between terminals 17 and 21 and formed in FIGURE 10A by the portions 63, 65 and 66, $\omega$ is the frequency of the substantially sinusoidal excitation, and $\omega_1$ is defined as $2/rcL^2$, then $$G_\gamma\left(\frac{\omega}{\omega_1}\right)=\frac{\gamma+(1+j)\left(\frac{\omega}{\omega_1}\right)^{1/2}\sinh\left[(1+j)\left(\frac{\omega}{\omega_1}\right)^{1/2}\right]}{\gamma\cosh\left[(1+j)\left(\frac{\omega}{\omega_1}\right)^{1/2}\right]+(1+j)\left(\frac{\omega}{\omega_1}\right)^{1/2}\sinh\left[(1+j)\left(\frac{\omega}{\omega_1}\right)^{1/2}\right]}$$

Furthermore, the phase angle or phase lag of the circuit $$\phi=\tan^{-1}\frac{b}{a}$$

where as before $a$ is the real part of $G_\gamma$ and $b$ is the imaginary part of $G_\gamma$.

It should be noted that the two gain expressions $$G_\alpha\left(\frac{\omega}{\omega_1}\right) \text{ and } G_\gamma\left(\frac{\omega}{\omega_1}\right)$$

are identical in form except that $\gamma$ replaces $\alpha$. Therefore, all curves that show $$G_\alpha\left(\frac{\omega}{\omega_1}\right)$$

and/or the phase shift for various values of $\alpha$ in connection with FIGS. 1, 2, 4 and 5 also hold for $$G_\gamma\left(\frac{\omega}{\omega_1}\right)$$

for various values of $\gamma$ where $\gamma$ equals $\alpha$.

Figure 10B:
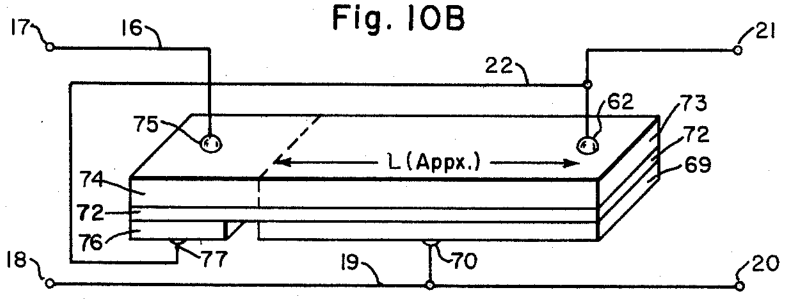

Particular reference is made now to FIGURE 10B in which an alternative construction is shown. In FIGURE 10B a layer of dielectric material 72 extends the entire length of the structure, and has adjacent the lower right hand surface thereof the conducting material 69. Adjacent the right hand portion of the upper surface of dielectric layer 72 and extending substantially the same longitudinal distance is a resistive layer 73, and at the left hand end thereof, and preferably formed integrally therewith, is a highly conductive region 74 having on the upper surface thereof ohmic contact 75 connected to lead 16, a portion of dielectric layer 72 opposite part of conductive portion 74 having on the lower surface thereof conducting material 76 connected at ohmic contact 77 to lead 22. It should be noted that a distance separates the conducting portion 76 and the conducting portion 69. The dielectric portion of 72 between conducting portion 76 and the adjacent part of conducting portion 74 serves to form the capacitor 80 of FIG. 9. In the apparatus of FIGURE 10B the effective length L is measured approximately between terminal 62 and the junction between portions 73 and 74, but as before geometrical considerations enter into the calculation of the effective length L.

It will be understood that the devices of FIGURES 10A and 10B are both suitable for monolithic construction, and such construction is contemplated.

In final summary, the invention in its broadest aspect consists of a monolithic structure, which may be a semiconductor structure, having ohmic connections thereto providing filter input and filter output terminals. The monolithic structure includes resistive, capacitative, and conductive areas including an area providing distributed resistance between a first filter input and a first filter output terminal, an area forming distributed capacitance adjacent the distributed resistance, and an impedance forming area. This impedance forming area may be almost purely capacitive in nature and may be connected between the first input and first output terminal, or the impedance forming area may be resistive and connected between the distributed capacitance and both the second input and second output terminals.

Whereas the invention has been shown and described with respect to some embodiments thereof which give satisfactory results, it should be understood that changes may be made and equivalents substituted without departing from the spirit and scope of the invention.

I claim as my invention:

1. A narrow band rejection filter circuit comprising, in combination, a semiconductor element composed of a lightly doped region of one conductivity type contiguous to a highly doped region of the other conductivity type and forming a p-n junction, a pair of spaced ohmic contacts on the region of said one conductivity type, an ohmic contact on the highly doped region of the other conductivity type, input lead means connected to one of the ohmic contacts on the lightly doped region, output lead means connected to the other ohmic contact on said lightly doped region, other input lead means connected to other output lead means, and circuit means including a lumped resistor and a variable source of direct current potential connecting one of said pair of ohmic contacts and the other output lead means to the ohmic contact of the highly doped region of said other conductivity type, said source of potential applying a reverse bias to the p-n junction creating a depletion layer adjacent the boundary between the highly doped region and the lightly doped region, said circuit providing frequency rejection over a frequency band determined by the values of the distributed capacitance and distributed resistance of the semiconductor element per unit length, the distance between the pair of ohmic contacts on the lightly doped region, the value of said resistor lumped and the amplitude of said direct current potential.

2. A narrow band rejection filter comprising, in combination, first and second input terminals, first and second output terminals, a semiconductor element constructed of a single p-n junction, said semiconductor element including a lightly doped region of one conductivity type contiguous to a highly doped region of the other conductivity type, first and second spaced ohmic contacts for the region of one conductivity type, the first ohmic contact being connected to the first input terminal, the second ohmic contact being connected to the first output terminal, the second input terminal being connected to the second output terminal, an additional ohmic contact for the region of the other conductivity type, said last-named ohmic contact extending over substantially the entire surface of said last-named region, a variable source of direct current potential, a lumped resistor, and circuit means connecting said variable source of potential and said resistor in series between said last-named ohmic contact and the second input terminal, said source of potential being of a polarity to apply a reverse bias to the p-n junction and create a depletion layer adjacent the boundary between the lightly doped region and the highly doped region, said filter having a no-load gain not exceeding unity substantially in accordance with the formula $$G=\left|\operatorname{sech}\left[(1+j)\left(\frac{\omega}{\omega_1}\right)^{1/2}\right]+\frac{1-\operatorname{sech}\left[(1+j)\left(\frac{\omega}{\omega_1}\right)^{1/2}\right]}{1+\frac{\alpha}{(1+j)}\frac{1}{\left(\frac{\omega}{\omega_1}\right)^{1/2}}\coth\left[(1+j)\left(\frac{\omega}{\omega_1}\right)^{1/2}\right]}\right|$$

where $$\alpha=\frac{rL}{R},\omega_1=\frac{2}{L^2rc}$$

$r$ is the distributed resistance per unit length,
$c$ is the distributed junction capacitance per unit length,
L is the device length measured between said first and second ohmic contacts, R is the resistance value of the lumped resistor, and $\omega$ is the angular frequency of a sinusoidal signal applied to the first and second input terminals.

3. A narrow band rejection filter circuit comprising, in combination, a semiconductor element composed of a lightly doped region of one conductivity type contiguous to a highly doped region of the other conductivity type and forming a p-n junction, a pair of spaced ohmic contacts on the region of said one conductivity type, an additional ohmic contact on the highly doped region of the other conductivity type, input lead means connected to one of the pair of ohmic contacts of the lightly doped region, output lead means connected to the other of the pair of ohmic contacts of said lightly doped region, other input lead means connected to other output lead means, circuit means including a lumped resistor connecting the other input lead means and other output lead means to the additional ohmic contact of the highly doped region of said other conductivity type, and other circuit means including a variable source of direct current potential for applying a reverse bias to the junction between the highly doped region and the lightly doped region to create a depletion layer adjacent the boundary between the highly doped region and the lightly doped region, said circuit providing for frequency rejection over a frequency band determined by the values of the distributed capacitance and the distributed resistance of the semiconductor element, the value of said lumped resistor and the amplitude of the direct current biasing potential.

4. A passive signal translation system comprising input terminals upon which input signals may be impressed, output terminals, one of which is common with one of said input terminals, a monolithic semiconductor element comprising a first lightly doped region of one conductivity type contiguous to a second highly doped region of the opposite conductivity type, first and second spaced ohmic contacts on said first region, a third ohmic contact covering substantially the entire surface of the second region of the other conductivity type, a connection including a lumped resistive impedance between said third contact and said common input-output terminal, other external circuit means including a variable source of direct current potential for applying a reverse bias to the junction between said highly doped region and said lightly doped region to back-bias the junction between the regions of different conductivity types to vary the values of the distributed resistance and capacitance of said regions of different conductivity for variably tuning said system, said lumped resistance impedance providing a common portion of all of the electrical paths between said third terminal and said first and second terminals.

5. A narrow band rejection filter comprising a monolithic semiconductor structure including a first region of one conductivity type and a second region of the opposite conductivity type in contiguous relation forming a p-n junction and a distributed resistance-capacitance network, a first ohmic contact on one end of said first region and a second ohmic contact spaced from said first contact, the portion of said first region between said ohmic contacts constituting a distributed resistance and in conjunction with said second region further constituting a distributed capacitance, a third ohmic contact on said second region, a first input signal terminal connected to said first ohmic contact, an output signal terminal connected to said second ohmic contact, a common input-output terminal and lumped non-distributed resistive impedance means connected between said third contact and said third terminal, external means for applying a variable back bias to said p-n junction for the function of tuning the rejection notch of the filter.

6. A narrow band rejection filter comprising a monolithic semiconductor structure including a first region of one conductivity type and a second region of the opposite conductivity type in contiguous relation with said first region forming a p-n junction and a distributed resistance-capacitance network, a first ohmic contact on the outer surface of the first of said regions and a second ohmic contact spaced from said first ohmic contact on the same surface, the portion of said first region between said ohmic contacts constituting a distributed resistance and in conjunction with said second region further constituting a distributed capacitance, a third ohmic contact on the outer surface of said second region, external means for applying a variable back bias to said p-n junction for the function of tuning the rejection notch of the filter, a first input signal terminal connected to said first ohmic contact, an output signal terminal connected to said second ohmic contact, a common input-output terminal, and lumped non-distributed resistive impedance means connected between said third contact and said third terminal, whereby the combination of said distributed RC network and said lumped resistance impedance means as defined provides a filter having a no-load gain G, as function of the input frequency, substantially in accordance with the formula $$G=\left|\operatorname{sech}\left[(1+j)\left|\frac{\omega}{\omega_1}\right|^{1/2}\right]+\frac{1-\operatorname{sech}\left[(1+j)\left|\frac{\omega}{\omega_1}\right|^{1/2}\right]}{1+\frac{\alpha}{(1+j)}\left|\frac{1}{\frac{\omega}{\omega_1}}\right|^{1/2}\coth\left[(1+j)\left|\frac{\omega}{\omega_1}\right|^{1/2}\right]}\right|$$

where $$\alpha=\frac{rL}{R},\ \omega_1=\frac{2}{L^2rc}$$

References Cited by the Examiner

UNITED STATES PATENTS

| | | | |
|---|---|---|---|
| 2,637,777 | 5/53 | Kilby et al. | |
| 2,889,499 | 6/59 | Rutz | 307—88.5 |
| 2,904,704 | 9/59 | Marinance | 307—88.5 |
| 3,022,472 | 2/62 | Tanenbaum et al. | 333—18 |

OTHER REFERENCES

Electronics, vol. 25, issue 4, pages 144–148, April 1952.

Hager Electronics, vol. 32, No. 36, pages 44–49, Sept. 4, 1959.

Harris: Bridged Reactance — Resistance Networks, Proc. IRE., vol. 37, August 1949, pages 882–887.

Langford: Three Approaches to Microminiaturization —Electronics, Dec. 11, 1959, pages 49–52.

HERMAN KARL SAALBACH, *Primary Examiner.*

ELI J. SAX, BENNETT G. MILLER, *Examiners.*